(12) United States Patent
Torii et al.

(10) Patent No.: US 7,001,014 B2
(45) Date of Patent: Feb. 21, 2006

(54) PIEZOELECTRIC THIN FILM AND METHOD FOR PREPARATION THEOF, AND PIEZOELECTRIC ELEMENT HAVING THE PIEZOELECTRIC THIN FILM, INK-JET HEAD USING THE PIEZOELECTRIC ELEMENT, AND INK-JET RECORDING DEVICE HAVING THE INK-JET HEAD

(75) Inventors: Hideo Torii, Higashiosaka (JP); Takeshi Kamada, Nara (JP); Isaku Kanno, Nara (JP); Ryoichi Takayama, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 139 days.

(21) Appl. No.: 10/381,995

(22) PCT Filed: Sep. 26, 2001

(86) PCT No.: PCT/JP01/08403

§ 371 (c)(1),
(2), (4) Date: Mar. 31, 2003

(87) PCT Pub. No.: WO02/29129

PCT Pub. Date: Apr. 11, 2002

(65) Prior Publication Data

US 2004/0004650 A1 Jan. 8, 2004

(30) Foreign Application Priority Data

Oct. 3, 2000 (JP) .......................... 2000-303371

(51) Int. Cl.
*B41J 2/45* (2006.01)

(52) U.S. Cl. .......................... 347/72; 347/68
(58) Field of Classification Search ............ 347/72, 347/68, 71, 62, 54, 77, 65, 47, 44
See application file for complete search history.

(56) References Cited

U.S. PATENT DOCUMENTS 5,235,352 A    8/1993   Pies et al.

(Continued)

FOREIGN PATENT DOCUMENTS

CN    1074408    7/1993

(Continued)

OTHER PUBLICATIONS

Low–Temperature Preparation of Pb(Zr,Ti)O3 Thin Films on (Pb,La)TiO3 Buffer laye by Multi–Ion–Beam Sputtering, by Isaku et al. Jpn. J. Appl. Phys. vol. 32 (1993), p. 4057–4060.*

(Continued)

*Primary Examiner*—Manish Shah
(74) *Attorney, Agent, or Firm*—Hamre, Schumann, Mueller & Larson, P.C.

(57) ABSTRACT

A piezoelectric thin film can achieve a large piezoelectric displacement. A chemical composition of the piezoelectric thin film is expressed by $Pb_{1+a}(Zr_xTi_{1-x})O_{3+a}$ ($0.2 \leq a \leq 0.6$ and $0.50 \leq x \leq 0.62$). The crystal structure of the piezoelectric thin film is a mixture of a perovskite columnar crystal region (24) having an ionic defect in which a portion of the constitutive elements of an oxygen ion, a titanium ion, and a zirconium ion is missing and a perovskite columnar crystal region (25) of stoichiometric composition having no ionic defect. This configuration allows a residual compressive stress in the crystal to be relaxed by the perovskite columnar crystal region (24) having an ionic defect, thus achieving a large piezoelectric displacement (displacement amount).

14 Claims, 9 Drawing Sheets

U.S. PATENT DOCUMENTS

| | | | |
|---|---|---|---|
| 5,650,806 A | | 7/1997 | Denne |
| 6,194,818 B1 | * | 2/2001 | Sumi et al. .................. 310/311 |
| 6,599,757 B1 | * | 7/2003 | Murai ............................ 438/3 |

FOREIGN PATENT DOCUMENTS

| | | |
|---|---|---|
| JP | 4-500640 | 2/1992 |
| JP | 6-57411 | 3/1994 |
| JP | 6-290983 | 10/1994 |
| JP | 7-18427 | 1/1995 |
| JP | 7-172996 | 7/1995 |
| JP | 10-209517 | 8/1998 |
| JP | 2000-6400 | 1/2000 |

OTHER PUBLICATIONS

Takayama, R., and Y. Tomita, "Preparation of Epitaxial $Pb(ZR_xTi_{1-x})O_3$ Thin Films and Their Crystallographic, Pyroelectric, and Ferroelectric Properties", J. App. Phys. 65(4), Feb. 15, 1989, pp1666–1670.

Kanno, I., and S. Hayashi, et al., "Low–Temperature Preparation of $Pb(Zr, Ti)O_3$ Thin Films on $(Pb, La)TiO_3$ Buffer Layer by Multi–Ion Beam Sputtering", J. Appl. Phys., vol. 32 (1993), pp4057–4060.

* cited by examiner

F I G. 2 (a)
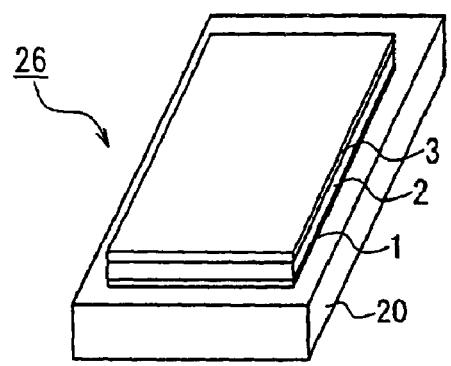
F I G. 2 (b)
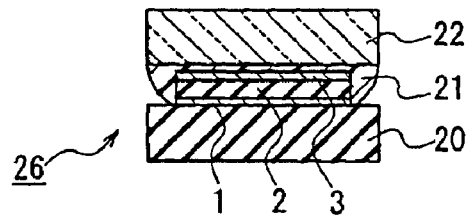
F I G. 2 (c)
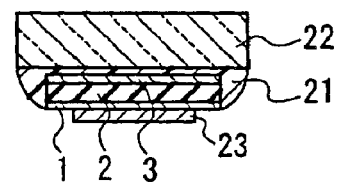
F I G. 2 (d)
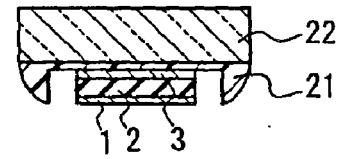
F I G. 2 (e)
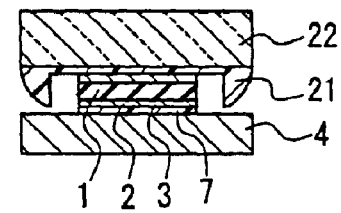
F I G. 2 (f)
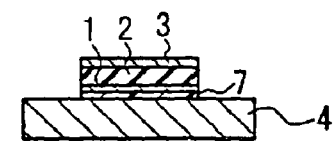

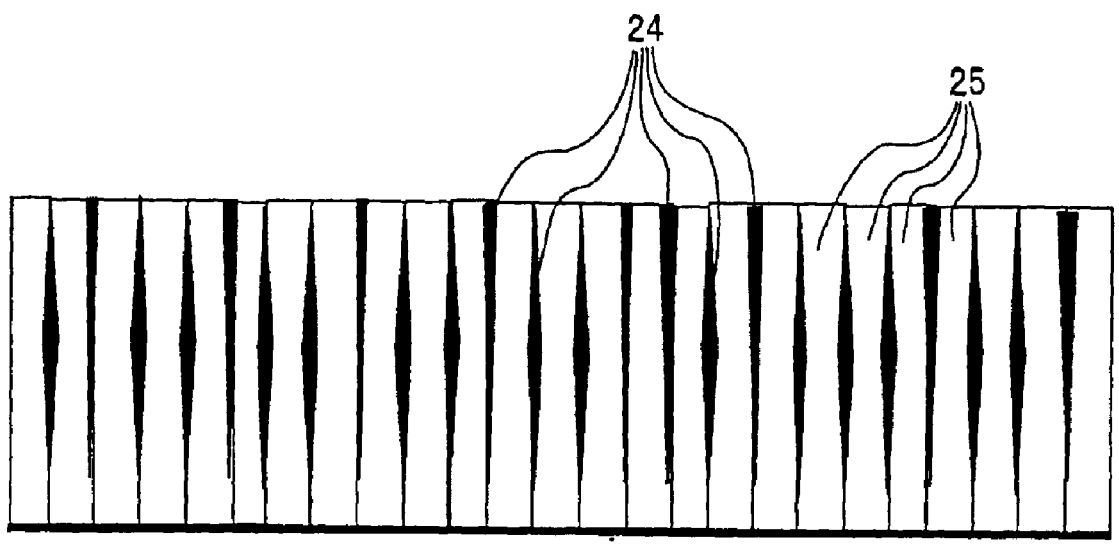
F I G. 3

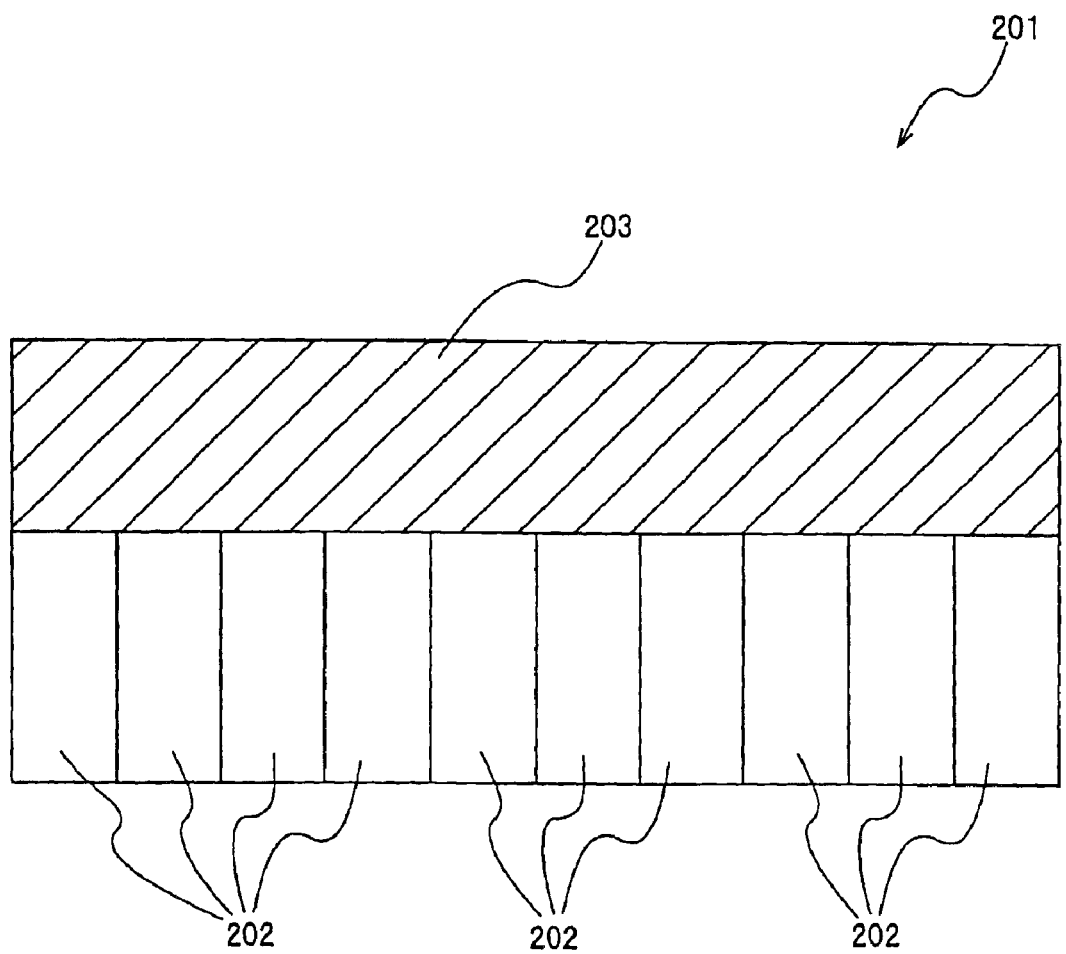
F I G. 6

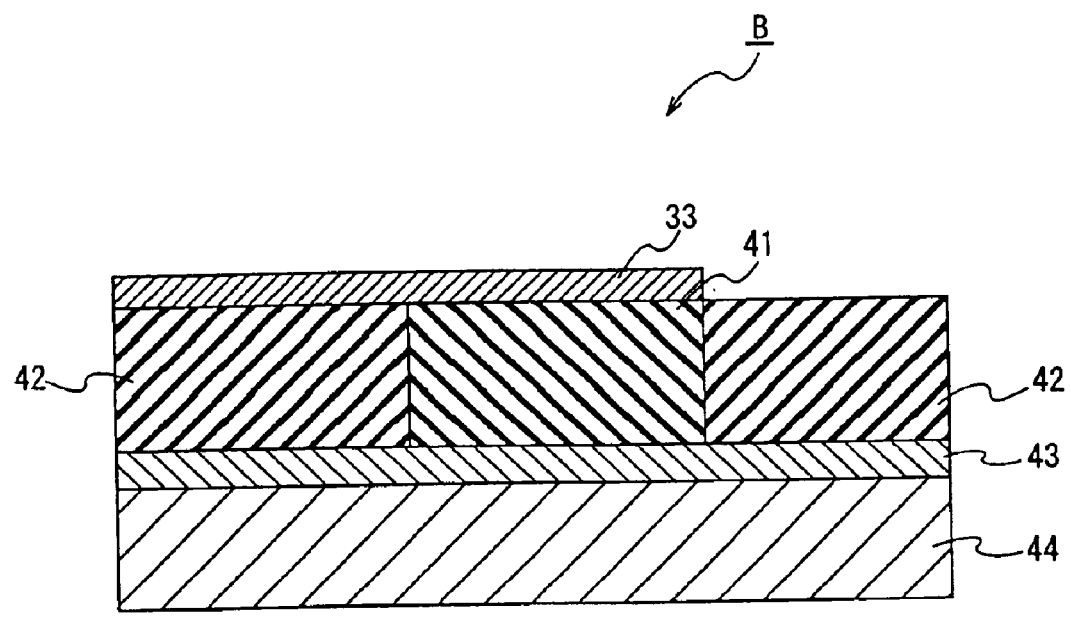
F I G. 8

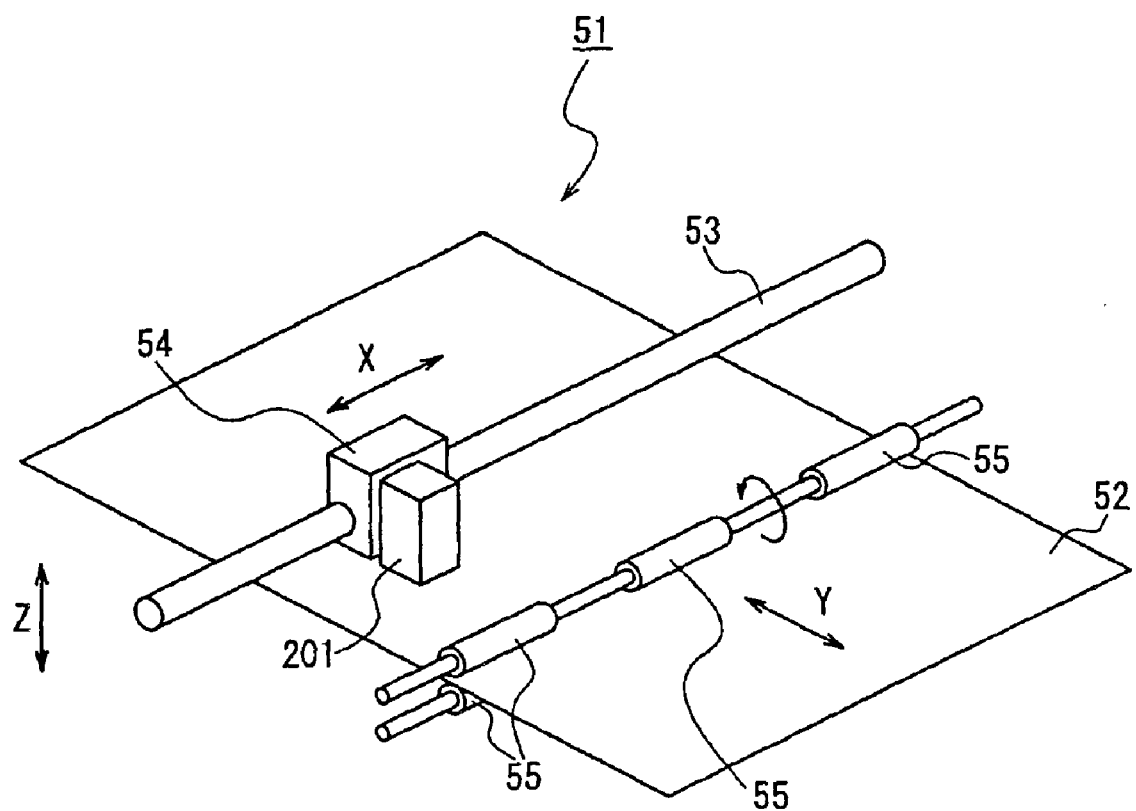
F I G. 9

PIEZOELECTRIC THIN FILM AND METHOD FOR PREPARATION THEOF, AND PIEZOELECTRIC ELEMENT HAVING THE PIEZOELECTRIC THIN FILM, INK-JET HEAD USING THE PIEZOELECTRIC ELEMENT, AND INK-JET RECORDING DEVICE HAVING THE INK-JET HEAD

TECHNICAL FIELD

The present invention relates to a piezoelectric thin film used in a micropump, a microspeaker, an ink jet head, etc., a method for manufacturing the piezoelectric thin film, a piezoelectric element including the piezoelectric thin film, an ink jet head including the piezoelectric element, and an ink jet recording apparatus including the ink jet head.

BACKGROUND ART

A piezoelectric material can make mechanical-to-electrical energy conversion or electrical-to-mechanical energy conversion. Examples of the typical piezoelectric material include lead zirconate titanate ($Pb(Zr, Ti)O_3$) (also referred to as "PZT" in the following). Particularly, PZT having a perovskite-type tetragonal crystal structure can achieve the largest piezoelectric displacement in a c-axis (<001> axis) direction. However, most piezoelectric materials are a polycrystalline material composed of aggregates of crystal grains whose crystal axes are oriented variously. Therefore, the spontaneous polarization Ps is arranged variously as well.

With the recent progress in miniaturization of electronic equipment, there has been a strong demand for a smaller piezoelectric element. To meet the demand, the piezoelectric element is being formed as a thin film having a much smaller volume than that of a widely used sintered body. Thus, the research and development on the piezoelectric element in the form of a thin film have been conducted actively. For example, PZT has the spontaneous polarization Ps that orients in the c-axis direction. Therefore, it is necessary to align the c-axis of crystals that constitute a PZT thin film in a direction perpendicular to the substrate surface so that the PZT thin film can have high piezoelectric characteristics. To achieve this, a conventional technique uses a magnesium oxide (MgO) single-crystal substrate that has a rock-salt crystal structure and is cut so that a plane of crystal orientation (100) is exposed to the surface, and a PZT thin film with the c-axis (<001> axis) oriented perpendicularly to the surface. The PZT thin film is formed on the MgO single-crystal substrate at 600° C. to 700° C. (e.g., J. Appl. Phys. vol. 65, No. 4 (15 February 1989) pp. 1666–1670 and JP 10(1998)-209517 A).

However, the thermal expansion coefficient of the MgO single-crystal substrate is $120 \times 10^{-7}$/deg, and that of PZT is $56 \times 10^{-7}$/deg. When the PZT thin film is formed on the MgO single-crystal substrate, the PZT thin film is subjected to a large compressive stress due to a difference in thermal expansion coefficient while it is cooled from the deposition temperature (600° C. to 700° C.) to room temperature. Therefore, the entire PZT thin film shrinks considerably, making it impossible to provide the property of extending and contracting in accordance with electrical energy, i.e., high piezoelectric characteristics. Even if the MgO single-crystal substrate is removed by etching, the compressive stress remains in the PZT thin film and cannot be relaxed completely because each ion in the crystal does not diffuse at about room temperature. Thus, a large piezoelectric displacement cannot be achieved.

DISCLOSURE OF INVENTION

Therefore, with the foregoing in mind, it is an object of the present invention to provide a piezoelectric thin film that can achieve a large piezoelectric displacement and a method for manufacturing the piezoelectric thin film.

It is another object of the present invention to provide a high-performance piezoelectric element, ink jet head, and ink jet recording apparatus.

A piezoelectric thin film of the present invention has a chemical composition expressed by $Pb_{1+a}(Zr_xI_{1-x})O_{3+a}$ ($0.2 \leq a \leq 0.6$ and $0.50 \leq x \leq 0.62$) and includes a perovskite columnar crystal region having an ionic defect in which a portion of the constitutive elements of an oxygen ion, a titanium ion, and a zirconium ion is missing, and a perovskite columnar crystal region of stoichiometric composition having no ionic defect.

The perovskite columnar crystal region having an ionic defect can be deformed like a flexible coil spring and absorb a residual compressive stress in the crystal. Therefore, the above configuration of a piezoelectric thin film of the present invention allows a residual compressive stress in the crystal to be relaxed by the perovskite columnar crystal region having an ionic defect, thus achieving a large piezoelectric displacement (displacement amount).

In the configuration of a piezoelectric thin film of the present invention, it is preferable that the diameter of a columnar crystal in the perovskite columnar crystal region of stoichiometric composition having no ionic defect is 150 nm to 400 nm.

In the configuration of a piezoelectric thin film of the present invention, it is preferable that X-ray diffraction shows that the piezoelectric thin film has a tetragonal perovskite crystal structure and grows in a c-axis direction.

In the configuration of a piezoelectric thin film of the present invention, it is preferable that electron diffraction observed when an electron beam is incident perpendicularly on the surface of the piezoelectric thin film shows a spot pattern of a c-plane of a perovskite single crystal.

A method for manufacturing a piezoelectric thin film of the present invention includes forming a first layer having a thickness of 0.005 μm to 0.05 μm on a substrate by using a target of lead lanthanum titanate for sputtering and forming a piezoelectric thin film on the first layer by using a target of lead zirconate titanate including excess lead oxide for sputtering. The first layer includes perovskite crystals with the c-axis growing perpendicularly to the surface of the substrate. The piezoelectric thin film has a chemical composition expressed by $Pb_{1+a}(Zr_xTi_{1-x})O_{3+a}$ ($0.2 \leq a \leq 0.6$ and $0.50 \leq x \leq 0.62$) and includes a perovskite columnar crystal region having an ionic defect in which a portion of the constitutive elements of an oxygen ion, a titanium ion, and a zirconium ion is missing, and a perovskite columnar crystal region of stoichiometric composition having no ionic defect.

In the manufacturing method of a piezoelectric thin film of the present invention, it is preferable that the diameter of a columnar crystal in the perovskite columnar crystal region of stoichiometric composition having no ionic defect is 150 nm to 400 nm.

In the manufacturing method of a piezoelectric thin film of the present invention, it is preferable that X-ray diffraction shows that the piezoelectric thin film has a tetragonal perovskite crystal structure and grows in a c-axis direction.

In the manufacturing method of a piezoelectric thin film of the present invention, it is preferable that electron diffraction observed when an electron beam is incident perpendicularly on the surface of the piezoelectric thin film shows a spot pattern of a c-plane of a perovskite single crystal.

A piezoelectric element of the present invention includes a pair of electrodes and a piezoelectric thin film formed between the pair of electrodes. The piezoelectric thin film has a chemical composition expressed by $Pb_{1+a}(Zr_xTi_{1-x})O_{3+a}$ ($0.2 \leq a \leq 0.6$ and $0.50 \leq x \leq 0.62$) and includes a perovskite columnar crystal region having an ionic defect in which a portion of the constitutive elements of an oxygen ion, a titanium ion, and a zirconium ion is missing, and a perovskite columnar crystal region of stoichiometric composition having no ionic defect.

The piezoelectric element of the present invention includes the piezoelectric thin film of the present invention that can achieve a large piezoelectric displacement (displacement amount), resulting in a high-performance piezoelectric element.

In the configuration of a piezoelectric element of the present invention, it is preferable that the diameter of a columnar crystal in the perovskite columnar crystal region of stoichiometric composition having no ionic defect is 150 nm to 400 nm.

In the configuration of a piezoelectric element of the present invention, it is preferable that X-ray diffraction shows that the piezoelectric thin film has a tetragonal perovskite crystal structure and grows in a c-axis direction.

In the configuration of a piezoelectric element of the present invention, it is preferable that electron diffraction observed when an electron beam is incident perpendicularly on the surface of the piezoelectric thin film shows a spot pattern of a c-plane of a perovskite single crystal.

An ink jet head of the present invention includes an ink discharge element and a drive source element for driving the ink discharge element. An actuator including a piezoelectric element that includes the piezoelectric thin film of the present invention provided between a pair of electrodes, a pressure chamber component for applying a pressure to liquid ink by a displacement of the actuator, a liquid ink passage component for supplying the liquid ink to the pressure chamber component, and a nozzle plate for forcing the liquid ink out are bonded together to form the ink discharge element. This ink jet head exhibits high ink discharge ability because it includes the piezoelectric element that can achieve a large piezoelectric displacement (displacement amount) by the actuator. Such high ink discharge ability makes it possible to increase the adjustment margin of a power supply voltage, so that a variation in ink discharge can be controlled easily.

A ink jet recording apparatus of the present invention includes the following: the ink jet head of the present invention; an ink jet head transfer means for transferring the ink jet head in the width direction of a recording medium; and a recording medium transfer means for transferring the recording medium in a direction substantially perpendicular to the transfer direction of the ink jet head. This ink jet recording apparatus includes the ink jet head that can easily control a variation in ink discharge. Therefore, recording variations of the recording medium can be reduced to achieve a highly reliable ink jet recording apparatus.

BRIEF DESCRIPTION OF DRAWINGS

FIG. 2 shows steps in a method for manufacturing a piezoelectric element of Embodiment 1 of the present invention.

FIG. 3 is a schematic diagram showing the cross section of a piezoelectric thin film of Embodiment 1 of the present invention.

FIG. 6 schematically shows the configuration of an ink jet head of Embodiment 2 of the present invention.

FIG. 8 is a cross-sectional view taken along the line VII—VII of FIG. 7, showing an actuator of an ink discharge element for an ink jet head of Embodiment 2 of the present invention.

FIG. 9 is a perspective view schematically showing the whole of an ink jet recording apparatus that includes an ink jet head, according to Embodiment 3 of the present invention.

BEST MODE FOR CARRYING OUT THE INVENTION

Hereinafter, the present invention will be described in more detail by way of embodiments.

Embodiment 1

Figure 1:
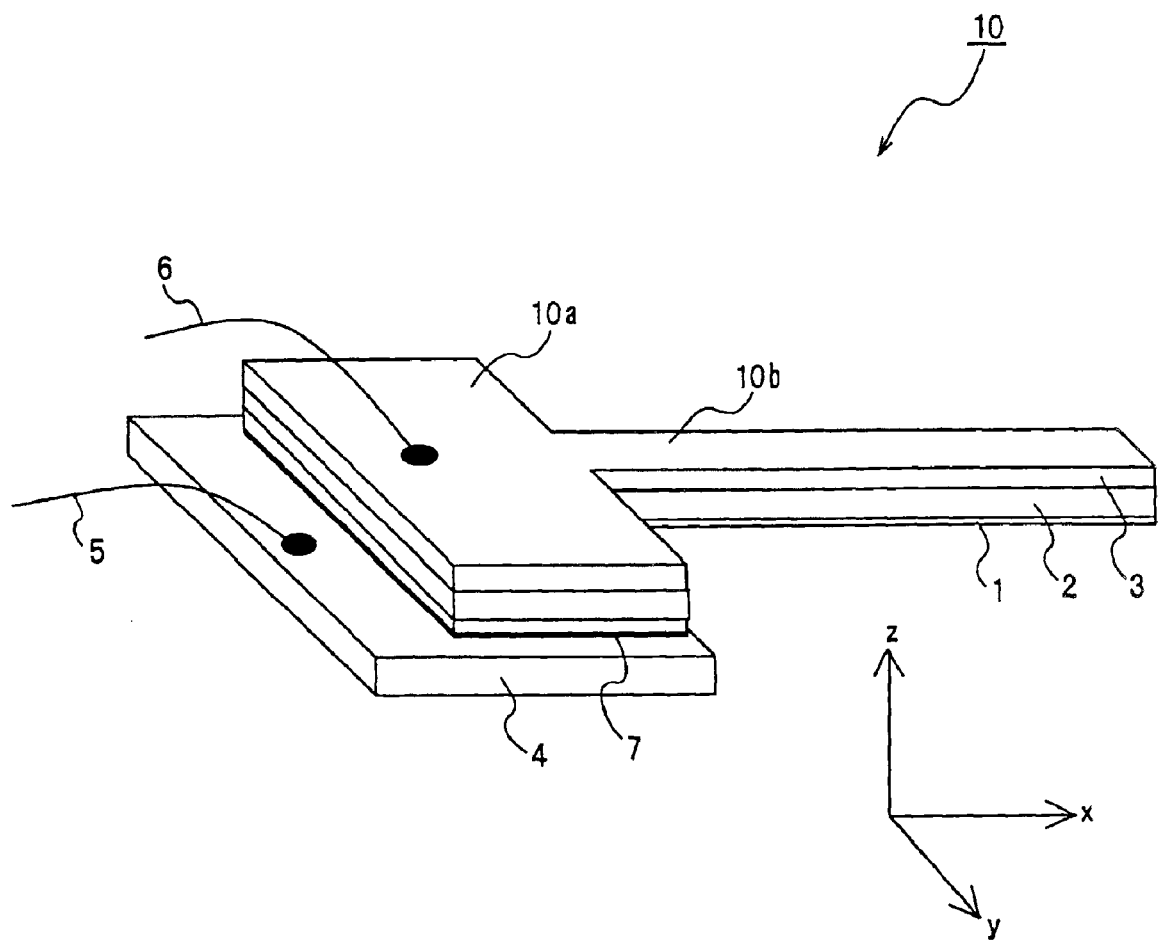
FIG. 1 is a perspective view showing a piezoelectric element of Embodiment 1 of the present invention.

FIG. 1 is a perspective view showing a piezoelectric element of Embodiment 1 of the present invention. As shown in FIG. 1, a piezoelectric element 10 of this embodiment is formed as a T-shaped flat plate having a length of 800 μm and a thickness of 4.1 μm. An end portion 10a (with a length of 300 μm) of the piezoelectric element 10 is wider than the other portion 10b (with a length of 500 μm). The end portion 10a has a width of 500 μm, and the other portion 10b has a width of 50 μm. The end portion 10a may be fixed to a conductive substrate (stainless substrate) 4 with a conductive adhesive (silver paste) 7, thereby forming a cantilever.

The piezoelectric element 10 may include a 0.1 μm-thick platinum lower electrode 1, a 2.5 μm-thick piezoelectric thin film 2 formed on the lower electrode 1, and a 1.5 μm-thick aluminum upper electrode 3 formed on the piezoelectric thin film 2. There is electrical continuity between the lower electrode 1 and the conductive substrate 4, and a lead wire 5 is connected to the conductive substrate 4. Moreover, a lead wire 6 is connected to the upper electrode 3 and may be positioned in the end portion 10a. When a voltage is applied across the lower electrode 1 and the upper electrode 3 via the lead wires 5, 6, the piezoelectric thin film 2 extends in the x direction of FIG. 1. The amount ΔL (m) of change in extension of the piezoelectric thin film 2 is expressed by $$\Delta L = d_{31} \times L \times E / t \qquad \text{Eq. 1}$$

where E (V) is an applied voltage, t (m) is a thickness of the piezoelectric thin film 2, L (m) is a length of the piezoelectric thin film 2, and $d_{31}$ (pm/V) is a piezoelectric constant of the piezoelectric thin film 2.

The lower portion of the piezoelectric thin film 2 that is joined to the lower electrode 1 having a small thickness can extend in the x direction. However, the upper portion of the piezoelectric thin film 2 that is joined to the upper electrode 3 having a large thickness cannot extend sufficiently due to the upper electrode 3. Consequently, the tip of the piezoelectric element 10 located opposite to the end portion 10a (a terminal side) that is fixed to the conductive substrate 4 displaces in the +z direction of FIG. 1. By repeating the application and removal of a voltage at a constant frequency, the tip of the piezoelectric element 10 moves up and down in the z direction with a predetermined displacement width. The relationship between the applied voltage and the magnitude of the displacement width is measured to evaluate the displacement characteristics of the piezoelectric thin film 2.

Next, a method for manufacturing the piezoelectric element 10 will be described with reference to FIG. 2. FIG. 2 shows steps in a method for manufacturing the piezoelectric element of Embodiment 1.

As shown in FIG. 2(a), a magnesium oxide (MgO) single-crystal substrate 20 is prepared, and a platinum (Pt) lower electrode 1 is formed on the single-crystal substrate 20 by sputtering. Then, a piezoelectric thin film 2 is formed on the lower electrode 1 by sputtering. The method for producing this piezoelectric thin film 2 is described in detail later. The single-crystal substrate 20 is cut so that a plane of crystal orientation (100) is exposed to the surface, and has a thickness of 0.3 mm and a surface size of 20 mm×10 mm. The lower electrode 1 has a thickness of 0.1 $\mu$m and includes the (100) plane as its surface. The piezoelectric thin film 2 has a thickness of 2.5 $\mu$m. An aluminum (Al) upper electrode 3 having a thickness of 1.5 $\mu$m is formed on the piezoelectric thin film 2 by sputtering. Thus, a laminated body 26 is produced that includes the single-crystal substrate 20, the lower electrode 1, the piezoelectric thin film 2, and the upper electrode 3.

As shown in FIG. 2(b), the laminated body 26 is bonded to a glass substrate 22 with an adhesive (acrylic resin) 21. The glass substrate 22 is arranged opposite to the upper electrode 3, and the adhesive 21 also is present between the glass substrate 22 and the upper electrode 3.

The single-crystal substrate 20 is removed with a phosphoric acid solution. As shown in FIG. 2(c), a T-shaped (see FIG. 1) photoresist pattern 23 is formed on the lower electrode 1.

As shown in FIG. 2(d), the lower electrode 1, the piezoelectric thin film 2, and the upper electrode 3 are processed into the shape and dimension of the piezoelectric element 10 in FIG. 1 by dry etching.

As shown in FIG. 2(e), one end of the lower electrode 1 (see the end portion 10a of the piezoelectric element 10 in FIG. 1) is fixed to a conductive substrate 4 with a conductive adhesive 7.

As shown in FIG. 2(f), the adhesive 21 is dissolved with an organic solvent (ethyl alcohol) and the glass substrate 22 is removed. Then, a lead wire 5 is attached to the conductive substrate 4, which is connected electrically to the lower electrode 1, and a lead wire 6 is attached to the upper electrode 3.

The piezoelectric thin film 2 is produced in the following manner.

The MgO single-crystal substrate 20 provided with the Pt lower electrode 1 including the (100) plane as its surface is preheated to 560° C. and kept at this temperature in the chamber of a RF magnetron sputtering apparatus. Using a target of lead lanthanum titanate ($Pb_{0.92}(La_{0.08}Ti)O_3$), a ultrathin film having a thickness of 0.02 $\mu$m is formed on the lower electrode 1. The ultrathin film is made of lanthanum-containing lead titanate that has a perovskite crystal structure in which the c-axis (<001> axis) grows perpendicularly to the surface. In this case, a mixed gas of argon and oxygen (the volume ratio $Ar:O_2=19:1$) is used as a sputtering gas, the total gas pressure is kept at 0.3 Pa, and a high-frequency power of 300 W is applied to perform sputtering for 10 minutes. It is desirable that the ultrathin film has a thickness of 0.005 $\mu$m to 0.05 $\mu$m.

Subsequently, the substrate temperature is increased to 600° C. Using a target obtained by adding 50% excess lead oxide (PbO) in molar ratio to lead zirconate titanate ($Pb(Zr_{0.53}Ti_{0.47})O_3$), a piezoelectric thin film 2 having a chemical composition expressed by $Pb1.50(Zr_{0.53}Ti_{0.47})O_{3.5}$ and a thickness of 2.5 $\mu$m is formed on the ultrathin film. In this case, a mixed gas of argon and oxygen (the volume ratio $Ar:O_2=19:1$) is used as a sputtering gas, the total gas pressure is kept at 0.3 Pa, and a high-frequency power of 600 W is applied to perform sputtering for 2 hours. It is desirable that the amount of lead oxide (PbO) added is 20% to 60% in molar ratio.

The X-ray diffraction analysis indicates that the piezoelectric thin film 2 has a tetragonal perovskite crystal structure and grows in the c-axis direction (i.e., only the c-axis orients perpendicularly to the surface).

The composition analysis with an X-ray microanalyzer indicates that the piezoelectric thin film 2 includes positive ions at a composition ratio of Pb:Zr:Ti=1.50:0.53:0.47 and can be expressed by $Pb_{1.50}(Zr_{0.53}Ti_{0.47})O_{3.5}$. The analysis of the interface between the piezoelectric thin film 2 and the platinum thin film (the lower electrode 1) and its vicinity with an X-ray microanalyzer indicates that a small amount of lanthanum is present near the surface of the platinum thin film (the lower electrode 1).

The analysis of electron diffraction observed when an electron beam is incident perpendicularly on the surface of the piezoelectric thin film 2 indicates a spot pattern of the c-plane of a perovskite single crystal.

Moreover, taking into account the transmission electron microscope analysis of the cross section of the piezoelectric thin film, the piezoelectric thin film 2 of this embodiment has a cross section schematically shown in FIG. 3. As shown in FIG. 3, the piezoelectric thin film 2 includes a perovskite columnar crystal region 24 having an ionic defect in which a portion of oxygen ions, titanium ions, and zirconium ions is missing, and a perovskite columnar crystal region 25 of stoichiometric composition having no ionic defect. With this configuration, a residual compressive stress in the crystal, which has been a problem in conventional techniques, can be relaxed by the perovskite columnar crystal region 24 having an ionic defect. It is desirable that a columnar crystal in the perovskite columnar crystal region 25 has a diameter of 150 nm to 400 nm.

Figure 4:
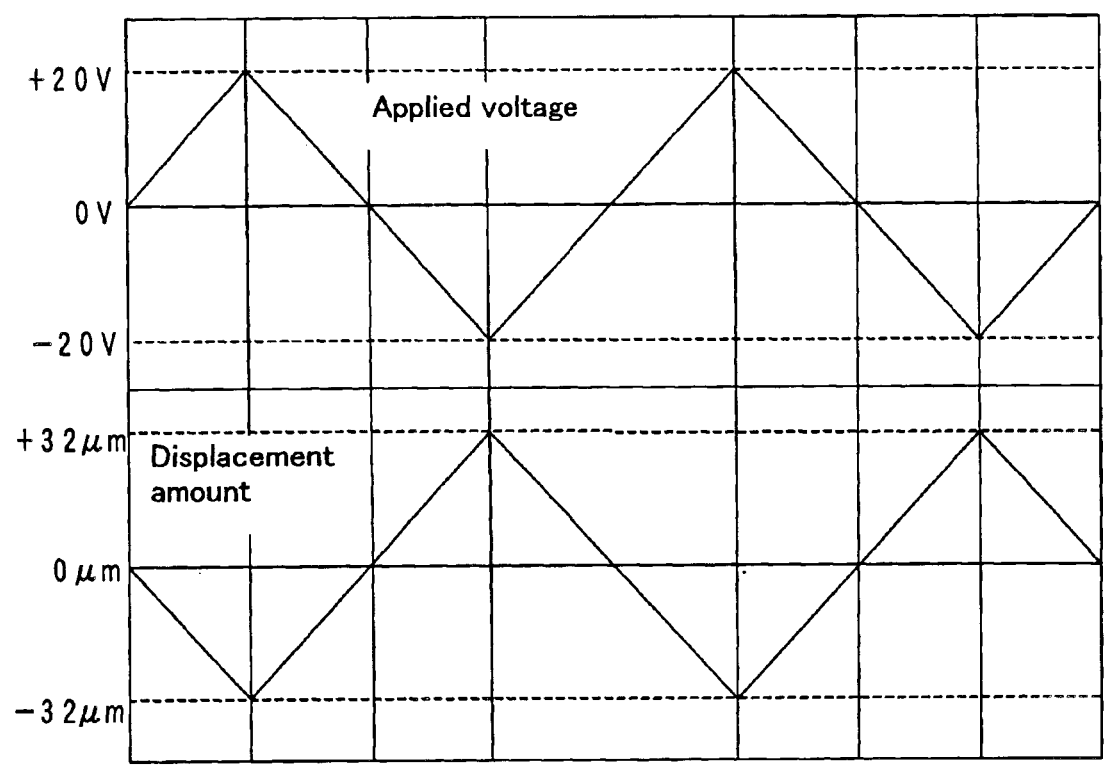
FIG. 4 is a characteristic diagram of a piezoelectric element of Embodiment 1 of the present invention.

A triangular wave voltage of ±20 V was applied across the lower electrode 1 and the upper electrode 3 of the piezoelectric element 10 thus produced via the lead wires 5, 6 to measure the amount of displacement of the tip of the piezoelectric element 10 moving up and down in the z direction. FIG. 4 shows the amount of displacement by the application of a voltage at a frequency of 10 Hz. As shown in FIG. 4, when a voltage of ±20 V is applied, the amount of displacement of the tip of the piezoelectric element 10 is ±32 $\mu$m at the maximum.

Using sputtering targets with different chemical compositions, piezoelectric elements were produced so as to differ from one another in composition and thickness of the piezoelectric thin film. Then, the amount of displacement for each piezoelectric element was measured in the same manner as described above. The material and thickness of the lower electrode 1 and the upper electrode 3 were the same as those of the piezoelectric element 10. Table 1 shows the results.

TABLE 1

| | | Configuration of piezoelectric thin film | | | | Forming conditions of piezoelectric thin film | | Displacement amount of piezoelectric element ($\mu$m) | Evaluation of displacement amount |
|---|---|---|---|---|---|---|---|---|---|
| | | $Pb_{1+a}(Zr_xTi_{1-x})O_{3+a}$ | | Thickness | Column | Target | Forming | | |
| Sample No. | | a | x | ($\mu$m) | diameter (nm) | composition | temperature (° C.) | | |
| 1 | Examples | 0.50 | 0.53 | 2.5 | 300 | $Pb(Zr_{0.53}Ti_{0.47})O_3$ + 0.50PbO | 600 | ±32 | ○ |
| 2 | | 0.60 | 0.53 | 2.5 | 300 | $Pb(Zr_{0.53}Ti_{0.47})O_3$ + 0.66PbO | 600 | ±33 | ○ |
| 3 | | 0.70 | 0.53 | 2.5 | 300 | $Pb(Zr_{0.53}Ti_{0.47})O_3$ + 0.75PbO | 600 | ±15 | X |
| 4 | | 0.40 | 0.53 | 2.5 | 300 | $Pb(Zr_{0.53}Ti_{0.47})O_3$ + 0.40PbO | 600 | ±32 | ○ |
| 5 | | 0.30 | 0.53 | 2.5 | 300 | $Pb(Zr_{0.53}Ti_{0.47})O_3$ + 0.30PbO | 600 | ±28 | ○ |
| 6 | | 0.20 | 0.53 | 2.5 | 300 | $Pb(Zr_{0.53}Ti_{0.47})O_3$ + 0.20PbO | 600 | ±25 | ○ |
| 7 | | 0.10 | 0.53 | 2.5 | 300 | $Pb(Zr_{0.53}Ti_{0.47})O_3$ + 0.10PbO | 600 | ±15 | X |
| 8 | | 0.50 | 0.45 | 2.5 | 300 | $Pb(Zr_{0.45}Ti_{0.55})O_3$ + 0.50PbO | 600 | ±6 | X |
| 9 | | 0.50 | 0.50 | 2.5 | 300 | $Pb(Zr_{0.50}Ti_{0.50})O_3$ + 0.50PbO | 600 | ±22 | ○ |
| 10 | | 0.50 | 0.55 | 2.5 | 300 | $Pb(Zr_{0.55}Ti_{0.45})O_3$ + 0.50PbO | 600 | ±24 | ○ |
| 11 | | 0.50 | 0.58 | 2.5 | 300 | $Pb(Zr_{0.58}Ti_{0.42})O_3$ + 0.50PbO | 600 | ±30 | ○ |
| 12 | | 0.50 | 0.62 | 2.5 | 300 | $Pb(Zr_{0.62}Ti_{0.38})O_3$ + 0.50PbO | 600 | ±25 | ○ |
| 13 | | 0.50 | 0.68 | 2.5 | 300 | $Pb(Zr_{0.58}Ti_{0.32})O_3$ + 0.50PbO | 600 | ±13 | X |
| 14 | | 0.50 | 0.53 | 2.5 | 150 | $Pb(Zr_{0.53}Ti_{0.47})O_3$ + 0.50PbO | 520 | ±36 | ○ |
| 15 | | 0.50 | 0.53 | 2.5 | 200 | $Pb(Zr_{0.53}Ti_{0.47})O_3$ + 0.50PbO | 550 | ±35 | ○ |
| 16 | | 0.50 | 0.53 | 2.5 | 400 | $Pb(Zr_{0.53}Ti_{0.47})O_3$ + 0.50PbO | 650 | ±28 | ○ |
| 17 | | 0.50 | 0.53 | 2.5 | 700 | $Pb(Zr_{0.53}Ti_{0.47})O_3$ + 0.50PbO | 700 | ±17 | ○ |
| 18 | | 0.50 | 0.53 | 7.0 | 300 | $Pb(Zr_{0.53}Ti_{0.47})O_3$ + 0.50PbO | 600 | ±37 | ○ |
| 19 | | 0.50 | 0.53 | 1.7 | 300 | $Pb(Zr_{0.53}Ti_{0.47})O_3$ + 0.50PbO | 600 | ±25 | ○ |
| 20 | Conventional example | 0.50 | 0.53 | 2.5 | 300 | $Pb(Zr_{0.53}Ti_{0.47})O_3$ | 600 | ±15 | X |

As can be seen from Table 1, when the molar ratio a of excess lead of the piezoelectric thin film having a chemical composition expressed by $Pb_{1+a}(Zr_xTi_{1-x})O_{3+a}$ is 0.2 to 0.6, a large amount of displacement can be achieved. When the molar ratio x of zirconium is 0.50 to 0.62, a large amount of displacement can be achieved. Moreover, when the thickness of the piezoelectric thin film is not less than 1.7 $\mu$m, a large amount of displacement can be achieved. However, when the piezoelectric thin film has a thickness of more than 7 $\mu$m, surface unevenness is increased during formation of the piezoelectric thin film, so that the upper electrode 3 is difficult to flatten. Consequently, it becomes difficult to produce the piezoelectric element stably while reducing variations in the amount of displacement.

Figure 5:
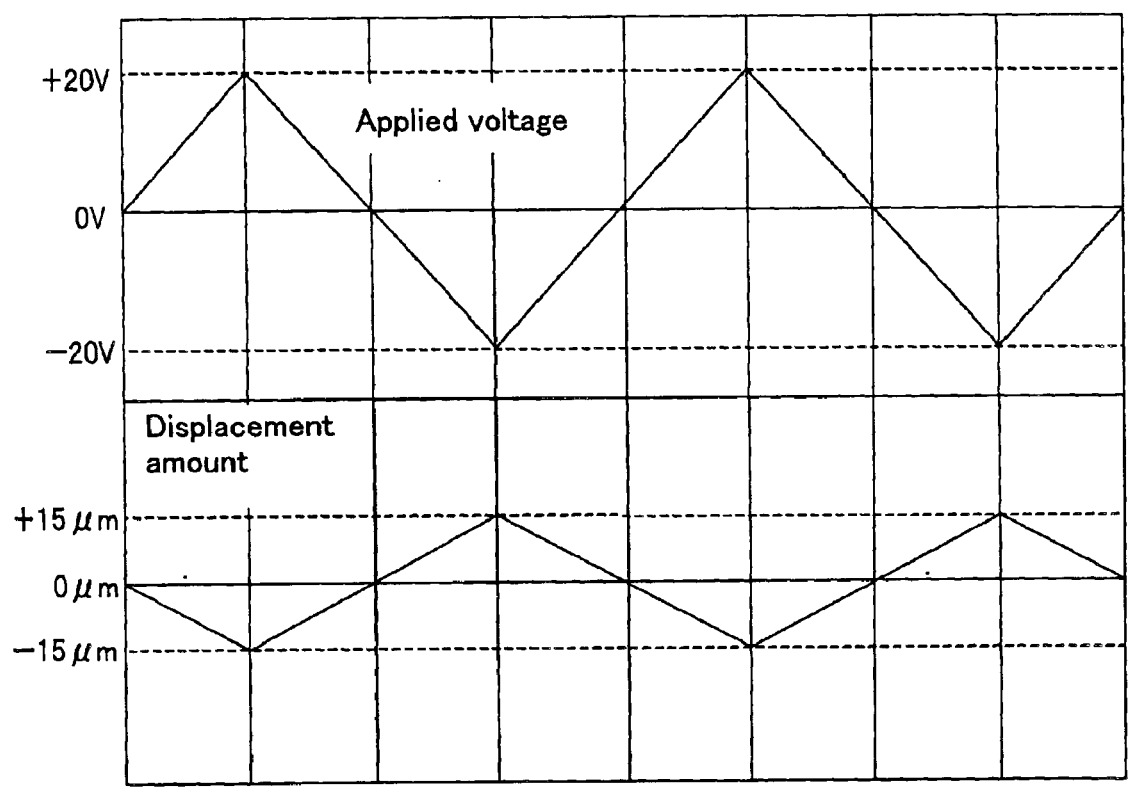
FIG. 5 is a characteristic diagram of a conventional piezoelectric element used in Embodiment 1 of the present invention.

As a comparative example, a piezoelectric element having the same configuration as that shown in FIG. 1 except for the use of a conventional piezoelectric thin film having a chemical composition expressed by $Pb(Zr_{0.53}Ti_{0.47})O_3$ was produced to measure the relationship between an applied voltage and a displacement amount. FIG. 5 shows the results. As shown in FIG. 5, when a voltage of ±20 V is applied, the amount of displacement of the tip of this piezoelectric element is ±15 $\mu$m at the maximum and smaller than that of the piezoelectric element of this embodiment. Table 1 also shows the result as the conventional example of No. 20.

As described above, the piezoelectric thin film of this embodiment has a chemical composition expressed by $Pb_{1+a}(Zr_xTi_{1-x})O_{3+a}$ (0.2≦a≦0.6 and 0.50≦x≦0.62) and includes the perovskite columnar crystal region 24 having a ionic defect in which a portion of the constitutive elements of an oxygen ion, a titanium ion, and a zirconium ion is missing, and the perovskite columnar crystal region 25 of stoichiometric composition having no ionic defect. Therefore, a residual compressive stress in the crystal can be relaxed by the perovskite columnar crystal region 24 having an ionic defect, thus achieving a large piezoelectric displacement (displacement amount).

Embodiment 2

An ink jet head using a piezoelectric thin film of the present invention will be described below.

FIG. 6 schematically shows the configuration of an ink jet head of Embodiment 2 of the present invention. As shown in FIG. 6, an ink jet head 201 of this embodiment includes ten ink discharge elements 202 that are the same in shape and arranged in a row, and a drive source element 203 that is connected to the electrode of each of the ink discharge elements 202 to drive them.

Figure 7:
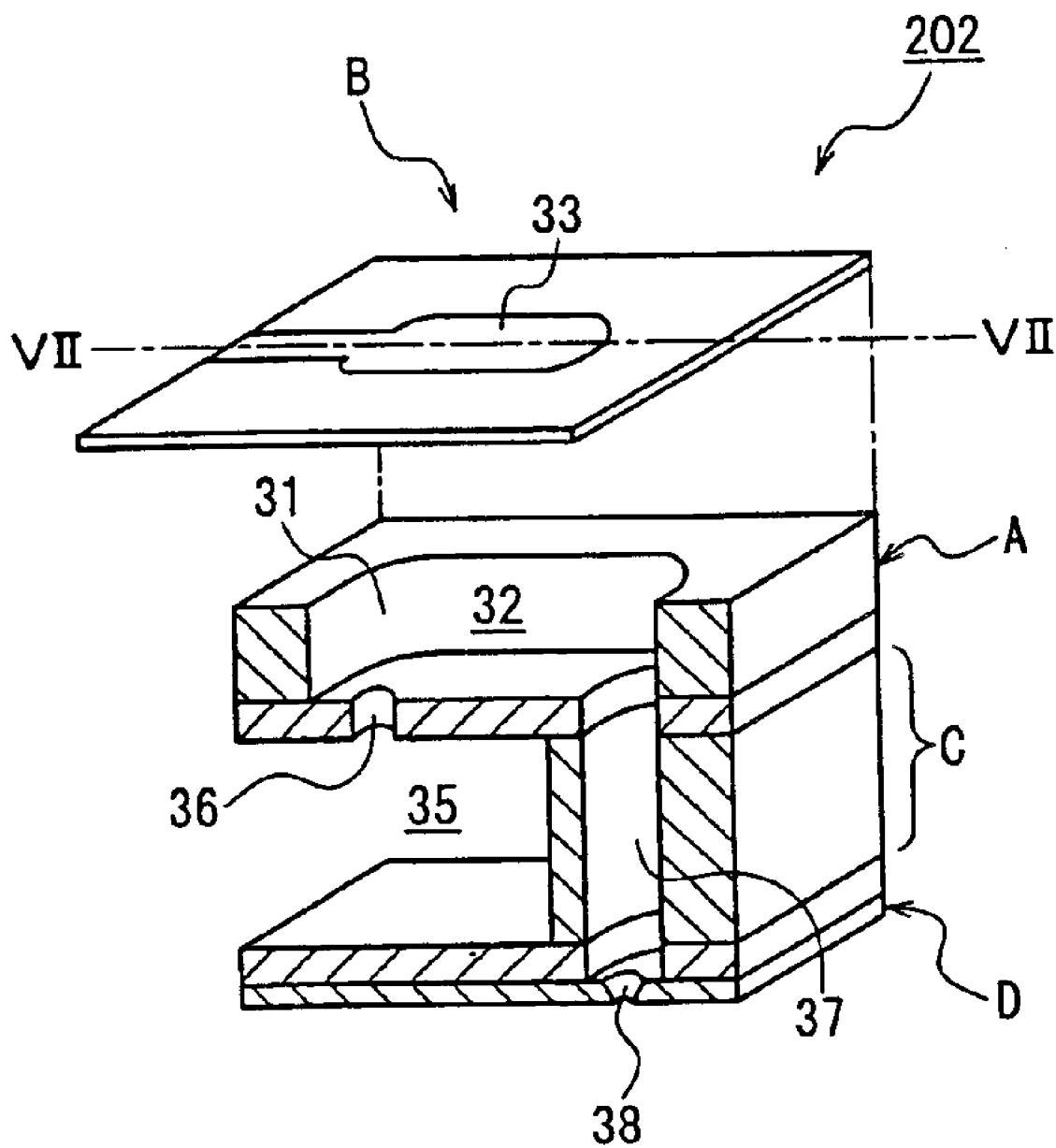
FIG. 7 is a partially cutaway exploded view in perspective of an ink discharge element for an ink jet head of Embodiment 2 of the present invention.

FIG. 7 is a partially cutaway exploded view in perspective of an ink discharge element for an ink jet head of Embodiment 2. In the ink discharge element 202 shown in FIG. 7, A represents a pressure chamber component having a pressure chamber opening 31. B represents an actuator that is arranged to cover the top (in the form of an ellipse with a minor axis of 200 $\mu$m and a major axis of 400 $\mu$m) of the pressure chamber opening 31. C represents a liquid ink passage component that is arranged to cover the bottom of the pressure chamber opening 31. Thus, the pressure chamber opening 31 is partitioned between the actuator B (located on the top) and the liquid ink passage component C (located at the bottom) to form a pressure chamber 32 having a thickness of 0.2 mm. The actuator B includes an individual electrode 33 that is arranged above the pressure chamber 32. The liquid ink passage component C includes the following: a common liquid chamber 35 that is shared among the pressure chambers 32 of each of the ink discharge elements 202 arranged in an ink supply direction; a supply vent 36 for connecting the common liquid chamber 35 and the pressure chamber 32; and an ink passage 37 through which the liquid ink flows out of the pressure chamber 32. D represents a nozzle plate having a nozzle hole 38 (with a diameter of 30 $\mu$m) that communicates with the ink passage 37. The above components A to D are bonded together with an adhesive to provide the ink discharge element 202. In FIG. 6, the drive source element 203 supplies a voltage to the individual electrode 33 of each of the ink discharge elements 202 via a bonding wire.

Next, the configuration of the actuator B will be described by referring to FIG. 8. FIG. 8 is a cross-sectional view taken along the line VII—VII of FIG. 7, showing an actuator of an ink discharge element for an ink jet head of Embodiment 2. As shown in FIG. 8, the actuator B includes an individual electrode 33, a piezoelectric thin film 41, and a common electrode 44. The individual electrode 33 is located on the upper side and made of a platinum (Pt) thin film having a thickness of 0.1 μm. The piezoelectric thin film 41 is located directly under the individual electrode 33 and has a thickness of 3.0 μm. The common electrode 44 also is used as a diaphragm that displaces and vibrates by the piezoelectric effect of this piezoelectric thin film 41. The piezoelectric thin film 41 is made of a piezoelectric material having a chemical composition expressed by $Pb1.50(Zr_{0.53}Ti_{0.47})O_{3.5}$. The common electrode 44 serving as a diaphragm is made of a conductive material, i.e., a chromium (Cr) thin film having a thickness of 3.5 μm and shared among the pressure chambers 32 of each of the ink discharge elements 202. The actuator B further includes an adhesive layer 43 arranged between the common electrode 44 and the respective piezoelectric thin films 41 to strengthen their adhesion. The adhesive layer 43 is made of a titanium (Ti) thin film having a thickness of 0.05 μm. Moreover, an electrical insulating organic film 42 of polyimide resin having the same thickness as the piezoelectric thin film 41 is formed around the piezoelectric thin film 41 on which the individual electrode 33 is formed. A portion of the individual electrode 33 that is processed in the form of a lead wire is above the electrical insulating organic film 42. The electrical insulating organic film 42 is formed by a printing process, and the other thin films are formed by sputtering.

In this ink jet head 201, the drive source element 203 supplies a voltage to the individual electrode 33 of each of the ink discharge elements 202 via a bonding wire, and the common electrode 44 displaces and vibrates by the piezoelectric effect of the piezoelectric thin film 41. Accordingly, the liquid ink in the common liquid chamber 35 flows through the supply vent 36, the pressure chamber 32, and the ink passage 37 and exits from the nozzle hole 38. The ink jet head 201 exhibits high ink discharge ability because it includes the piezoelectric thin film 41 that can achieve a large piezoelectric displacement (displacement amount). Such high ink discharge ability makes it possible to increase the adjustment margin of a power supply voltage. Therefore, a variation in ink discharge between the ink discharge elements 202 can be controlled easily.

Embodiment 3

An ink jet recording apparatus including an ink jet head of the present invention will be described below.

FIG. 9 is a perspective view schematically showing the whole of an ink jet recording apparatus of Embodiment 3 of the present invention. As shown in FIG. 9, an ink jet recording apparatus 51 of this embodiment includes the ink jet head 201 of Embodiment 2 that uses the piezoelectric effect of a piezoelectric thin film for recording. The ink drops discharged from the ink jet head 201 strike a recording medium 52 such as a paper, so that information can be recorded on the recording medium 52. A carriage 54 is attached slidably to a carriage shaft 53 that is arranged parallel to a main scanning direction (indicated by X in FIG. 9), and the ink jet head 201 is mounted on the carriage 54. As the carriage 54 goes backward and forward along the carriage shaft 53, the ink jet head 201 moves in the main scanning direction X. The ink jet recording apparatus 51 further includes a plurality of rollers (recording medium transfer means) 55. The rollers 55 transfer the recording medium 52 in a sub-scanning direction Y that is substantially perpendicular to the width direction (i.e., the main scanning direction X) of the ink jet head 201.

As described above, the ink jet recording apparatus includes the ink jet head 201 of Embodiment 2 that can easily control a variation in ink discharge between the ink discharge elements. Therefore, recording variations of the recording medium 52 (e.g., a paper) can be reduced to achieve a highly reliable ink jet recording apparatus.

INDUSTRIAL APPLICABILITY

A piezoelectric thin film of the present invention can achieve a large piezoelectric displacement (displacement amount) and is usable for an ink jet head that requires improved ink discharge ability.

What is claimed is:

1. A piezoelectric thin film having a chemical composition expressed by $Pb_{1+a}(Zr_xT_{1-x})O_{3+a}$ ($0.2 \leq a \leq 0.6$ and $0.50 \leq x \leq 0.62$), comprising:
   a perovskite columnar crystal region having an ionic defect in which a portion of the constitutive elements of an oxygen ion, a titanium ion, and a zirconium ion is missing; and
   a perovskite columnar crystal region of stoichiometric composition having no ionic defect.

2. The piezoelectric thin film according to claim 1, wherein a diameter of a columnar crystal in the perovskite columnar crystal region of stoichiometric composition having no ionic defect is 150 nm to 400 nm.

3. The piezoelectric thin film according to claim 1, wherein X-ray diffraction shows that the piezoelectric thin film has a tetragonal perovskite crystal structure and grows in a c-axis direction.

4. The piezoelectric thin film according to claim 1, wherein electron diffraction observed when an electron beam is incident perpendicularly on a surface of the piezoelectric thin film shows a spot pattern of a c-plane of a perovskite single crystal.

5. An ink jet head comprising:
   an ink discharge element; and
   a drive source element for driving the ink discharge element,
   wherein an actuator comprising a piezoelectric element that comprises the piezoelectric thin film according to claim 1 provided between a pair of electrodes, a pressure chamber component for applying a pressure to liquid ink by a displacement of the actuator, a liquid ink passage component for supplying the liquid ink to the pressure chamber component, and a nozzle plate for forcing the liquid ink out are bonded together to form the ink discharge element.

6. A ink jet recording apparatus comprising:
   the ink jet head according to claim 5,
   an ink jet head transfer means for transferring the ink jet head in a width direction of a recording medium; and
   a recording medium transfer means for transferring the recording medium in a direction substantially perpendicular to the transfer direction of the ink jet head.

7. A method for manufacturing a piezoelectric thin film comprising:
   forming a first layer having a thickness of 0.005 μm to 0.05 μm on a substrate by using a target of lead lanthanum titan ate for sputtering, and
   forming a piezoelectric thin film on the first layer by using a target of lead zirconate titanate including an excess lead oxide for sputtering, wherein the first layer comprises perovskite crystals with a c-axis growing perpendicularly to a surface of the substrate, and the piezoelectric thin film has a chemical composition expressed by $Pb_{1+a}(Zr_xTi_{1-x})O_{3+a}$ ($0.2 \leq a \leq 0.6$ and $0.50 \leq x \leq 0.62$) and comprises a perovskite columnar crystal region having an ionic defect in which a portion of the constitutive elements of an oxygen ion, a titanium ion, and a zirconium ion is missing, and a perovskite columnar crystal region of stoichiometric composition having no ionic defect.

8. The method according to claim 7, wherein a diameter of a columnar crystal in the perovskite columnar crystal region of stoichiometric composition having no ionic defect is 150 nm to 400 nm.

9. The method according to claim 7, wherein X-ray diffraction shows that the piezoelectric thin film has a tetragonal perovskite crystal structure and grows in a c-axis direction.

10. The method according to claim 7, wherein electron diffraction observed when an electron beam is incident perpendicularly on a surface of the piezoelectric thin film shows a spot pattern of a c-plane of a perovskite single crystal.

11. A piezoelectric element comprising:

a pair of electrodes; and a piezoelectric thin film formed between the pair of electrodes, wherein the piezoelectric thin film has a chemical composition expressed by $Pb_{1+a}(Zr_xTi_{1-x})O_{3+a}$ ($0.2 \leq a \leq 0.6$ and $0.50 \leq x \leq 0.62$) and comprises a perovskite columnar crystal region having an ionic defect in which a portion of the constitutive elements of an oxygen ion, a titanium ion, and a zirconium ion is missing, and a perovskite columnar crystal region of stoichiometric composition having no ionic defect.

12. The piezoelectric element according to claim 11, wherein a columnar crystal has a diameter of 150 nm to 400 nm.

13. The piezoelectric element according to claim 11, wherein X-ray diffraction shows that the piezoelectric thin film has a tetragonal perovskite crystal structure and grows in a c-axis direction.

14. The piezoelectric element according to claim 11, wherein electron diffraction observed when an electron beam is incident perpendicularly on a surface of the piezoelectric thin film shows a spot pattern of a c-plane of a perovskite single crystal.

* * * * *

UNITED STATES PATENT AND TRADEMARK OFFICE
CERTIFICATE OF CORRECTION

PATENT NO.       : 7,001,014 B2
APPLICATION NO.  : 10/381995
DATED            : February 21, 2006
INVENTOR(S)      : Torii et al.

It is certified that error appears in the above-identified patent and that said Letters Patent is hereby corrected as shown below:

On Title page item 54 Col. 1, Line 2(title): "THEOF" should read --THEREOF--
Page 1, second column, line 17(other publications): "Buffer laye" should read --Buffer layer--
Column 10, line 64(claim 7): "titan ate" should read --titanate--

Signed and Sealed this

Sixteenth Day of January, 2007

JON W. DUDAS
*Director of the United States Patent and Trademark Office*